(12) United States Patent
Jonsson et al.

(10) Patent No.: US 6,496,125 B2
(45) Date of Patent: Dec. 17, 2002

(54) A/D CONVERSION

(75) Inventors: Bengt Erik Jonsson, Spånga (SE); Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/808,218

(22) Filed: Mar. 14, 2001

(65) Prior Publication Data

US 2001/0030619 A1 Oct. 18, 2001

(30) Foreign Application Priority Data

Mar. 14, 2000 (SE) .............................................. 0000843

(51) Int. Cl.$^7$ ................................................ H03M 1/06
(52) U.S. Cl. ...................................... 341/118; 341/159
(58) Field of Search .................................. 341/155, 159, 341/118, 120

(56) References Cited

U.S. PATENT DOCUMENTS

| | | | |
|---|---|---|---|
| 5,262,779 A | 11/1993 | Sauer | 341/161 |
| 5,499,027 A | 3/1996 | Karanicolas et al. | 341/120 |
| 5,870,041 A | 2/1999 | Lee et al. | 341/118 |
| 5,874,911 A * | 2/1999 | Kodama | 341/156 |
| 6,104,329 A * | 8/2000 | Kawano | 341/139 |
| 6,268,820 B1 * | 7/2001 | Sherry et al. | 341/155 |

FOREIGN PATENT DOCUMENTS

| DE | 3726582 A1 | 2/1989 | H03M/1/50 |
|---|---|---|---|

OTHER PUBLICATIONS

U.K. Moon, and B.S. Song, "Background Digital Calibration Techniques for Pipelined ADC's", IEEE Trans. Circ. Syst. II, pp. 102–109, vol. 44, No. 2, Feb. 1997.
S.U. Kwak, B.S. Song & K. Barcrania, "A 15–b Msample/s Low–Spurious CMOS ADC", IEEE J. Solid–State Circ., pp. 1866–1875, vol. 32, No. 12, Dec. 1997.
O.E. Erdogan, P.J. Hurst, and S.H. Lewis, "A 12b Digital–Background–Calibrated Algorithmic ADC with –90dB THD", 1999 Intl. Solid State Circ. Conf., pp. 316–317, Feb. 1999.
J. Ingino Jr., and B. Wooley, "A Continuously–Calibrated 10 Msample/s 12b 3.3V ADC", 1998 Intl. Solid–State Circ. Conf., pp. 144–145, Feb. 1998.
K. Dyer, D. Fu, P. Hurst, & S. Lewis, "A Comparison of Monolithic Background Calibration In Two Time –Interleaved Analog–To–Digital Converters", pp. 13–16, 1998.
U. Gatti, G. Gazzoli, & F. Maloberti, "Improving the Linearity In High– Speed Analog–To–Digital Converters", pp. 17–21, 1998.

* cited by examiner

Primary Examiner—Peguy Jeanpierre
(74) Attorney, Agent, or Firm—Burns, Doane, Swecker & Mathis, L.L.P.

(57) ABSTRACT

An A/D converter system includes a first A/D converter with calibration circuitry. Also included in the system is an auxiliary A/D converter having a lower performance level than the first A/D converter. Circuitry is provided for temporarily switching an A/D conversion from the first A/D converter to the auxiliary A/D converter during short time intervals used for calibration of the first A/D converter. The rate at which the A/D conversion is switched is lower than the sampling rate of the first A/D converter.

13 Claims, 5 Drawing Sheets

A/D CONVERSION

BACKGROUND

The present invention relates to A/D converters (analog-to-digital converters), and in particular how to enable background calibration of such converters.

The maximum achievable accuracy-speed performance of any A/D-converter is limited by non-ideal effects associated with its building blocks. Typically, the performance is limited by settling time, finite amplifier gain and/or analog component mismatch. When designing high-speed, high-accuracy A/D converters, these limitations impose very stringent demands on the building blocks, leading to prolonged design time. They also require the use of manufacturing processes that are optimized for component matching and performance, thus increasing the manufacturing cost.

Many non-ideal effects can be compensated for by using calibration. The problem is that the efficiency of the calibration may be degraded by drift and ageing. Therefore it is desirable to be able to continuously calibrate the A/D converter during normal operation.

One of the more popular approaches to background calibration is to use the "skip-and-fill" approach [1]–[2]. During normal operation, every $k^{th}$ sample is skipped, and the hardware is reconfigured to perform a calibration operation. The gap representing the skipped sample is filled by interpolation by using a number of adjacent samples. The problem with these solutions is that interpolation can only predict the skipped sample accurately when the input signal has a limited bandwidth. If the input signal is completely random, or if it can have any frequency over the entire Nyquist bandwidth, any guess is as good as the interpolated value. In the implementation described in [2], the performance is seen to degrade significantly for input frequencies above ⅔ of the Nyquist frequency ($f_s/2$). So, even with as much as 44 taps interpolation (22 samples before, and 22 samples after the gap), it is not possible to accurately track more than ⅔ of the Nyquist bandwidth. This is in accordance with the theory described in [1]. Such a high-order interpolation requires a significant amount of digital hardware, and a long output delay (latency).

Another method to create a calibration time-slot is found in [3], where an input sample queue is formed by a cascade of sample-and-hold circuits. By emptying the queue slightly faster than it is filled, a calibration time-slot is occasionally available. The drawback with the "input-queue" method is that each extra sample-and-hold stage adds distortion and noise. Therefore this approach is not optimal for high-speed, high-resolution A/D converters.

A background calibration approach applicable to pipelined A/D converters is proposed in [4]. The principle is to temporarily remove the pipeline stage to be calibrated from the signal path, and replace it with a substitute extra pipeline stage. Calibration of the disconnected pipeline-stage is then performed outside the pipeline. This "hardware-substitution" method is limited in several ways:

1. Its application is limited to pipeline A/D converters, or at least to A/D converter architectures having a cascade of identical stages.
2. The calibration is done outside of the conversion signal path, which means that the stage under calibration is not seeing the same environment as during normal operation. This may lead to incomplete calibration.
3. The conversion signal path is always filled with conversion samples. Thus it is not possible to insert a calibration value in the pipeline, or switch the pipeline to calibration mode. This effectively rules out the use of a large range of high-performance digital calibration schemes, such as the ones described in [5]–[6].

Another class of A/D converters is described in [7]. These A/D converters use several identical low sample rate A/D conversion units in parallel to build a high sample rate A/D converter. The units sample the analog signal in a cyclical manner. Calibration of one unit may be performed when another unit is sampling. Thus, no interpolation is necessary. However, this type of parallel converter is also very complex and expensive.

SUMMARY

An object of the present invention is to enable the use of a wide range of calibration methods, without the inherent signal-bandwidth limitations imposed by the interpolation used in prior-art "skip-and-fill" methods and at a lower cost than the parallel A/D converter solution.

This object is achieved in accordance with the attached claims.

Briefly, the present invention provides a low performance auxiliary A/D converter that occasionally replaces the regular A/D converter for calibration purposes. Here the term "low performance" means lower performance than the regular A/D converter. The fact that the auxiliary A/D converter only has to be used occasionally (low sampling rate) means that the requirements on the auxiliary A/D converter are lower. Thus, parameters such as bit resolution and settling/conversion time are less critical.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
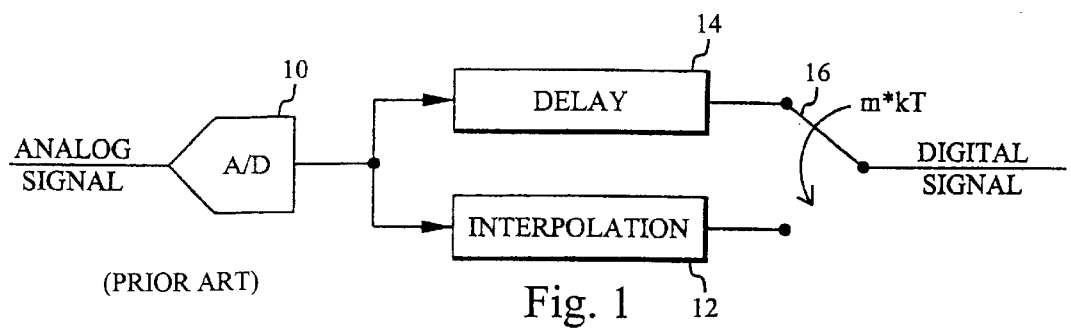
FIG. 1 is a block diagram of a conventional A/D converter with an interpolator.

FIG. 1 is a block diagram of a conventional A/D converter with an interpolator.

An analog signal is forwarded to an A/D converter 10. The digital samples are forwarded to an interpolator 12 and a delay element 14. A switch 16 is normally in the indicated upper position, in which the digital samples from delay element 14 are outputted at a sampling interval T. Every $k^{th}$ sample switch 16 is forced to its lower position, in which a sample is skipped and an interpolated digital sample from interpolator 12 is outputted instead. Thereafter switch 16 returns to its upper position. Calibration, or a part of a complete calibration of A/D converter 10 is performed during the interpolation.

Figure 2:
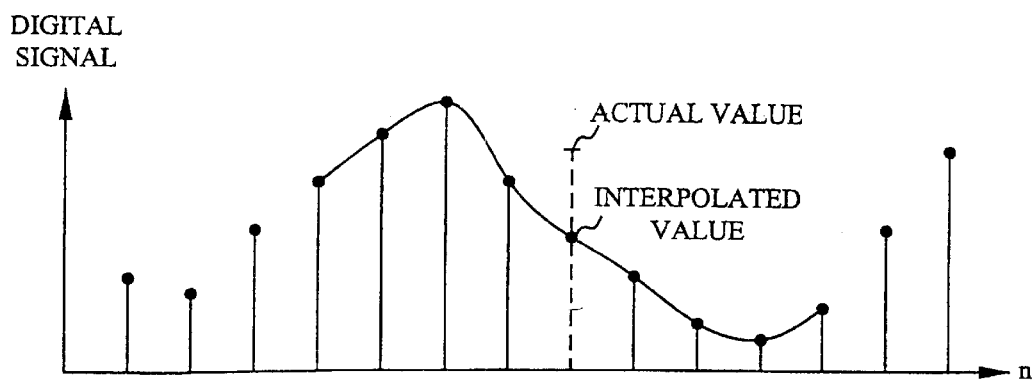
FIG. 2 is a time diagram illustrating sampling with the A/D converter of FIG. 1.

FIG. 2 is a time diagram illustrating sampling with the A/D converter of FIG. 1. The dashed line denotes the actual value of the skipped sample. Due to the limited bandwidth of the interpolation, the interpolated value may be different from this actual value. The interpolated value lies on the illustrated interpolation curve that is formed by surrounding samples. These surrounding samples are the reason for delay element 14 in FIG. 1 (in order to be able to interpolate, samples are required both before and after the skipped sample).

Figure 3:
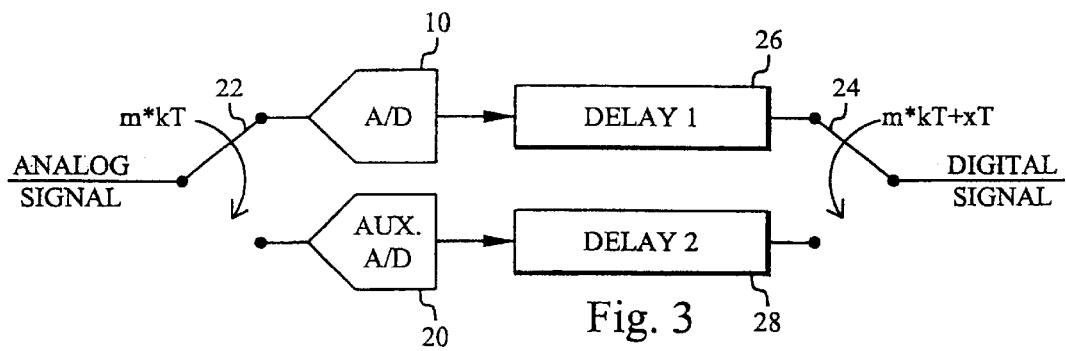
FIG. 3 is a block diagram of an embodiment of the A/D converter in accordance with the present invention.

FIG. 3 is a block diagram of an embodiment of the A/D converter in accordance with the present invention. A normally used regular A/D converter 10 is supplemented by an auxiliary, low performance A/D converter 20, which is only used occasionally when regular A/D converter 10 is calibrated. Preferably A/D converter 20 is implemented on the same chip as regular A/D converter 10, but it may also be implemented separately. Switching between the two A/D converters is performed by synchronized switches 22 and 24. If necessary, two delay elements 26 and 28 with different delays may be provided after A/D converter 10 and 20, respectively, in order to compensate for a longer settling/conversion time of auxiliary A/D converter 20 and time-align the two data streams.

Figure 4:
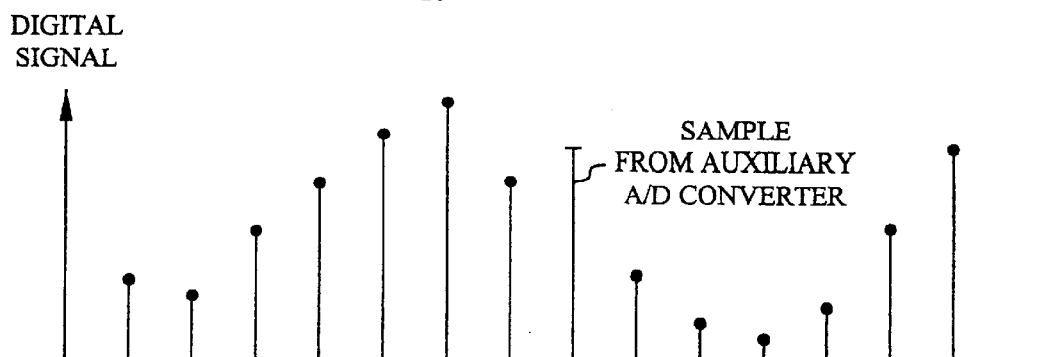
FIG. 4 is a time diagram illustrating sampling with the A/D converter of FIG. 3.

FIG. 4 is a time diagram illustrating sampling with the A/D converter of FIG. 3. It is noted that in this case the actual value of the skipped (by regular A/D converter 10) sample is obtained from auxiliary A/D converter 20 (possibly at lower resolution).

Figure 5:
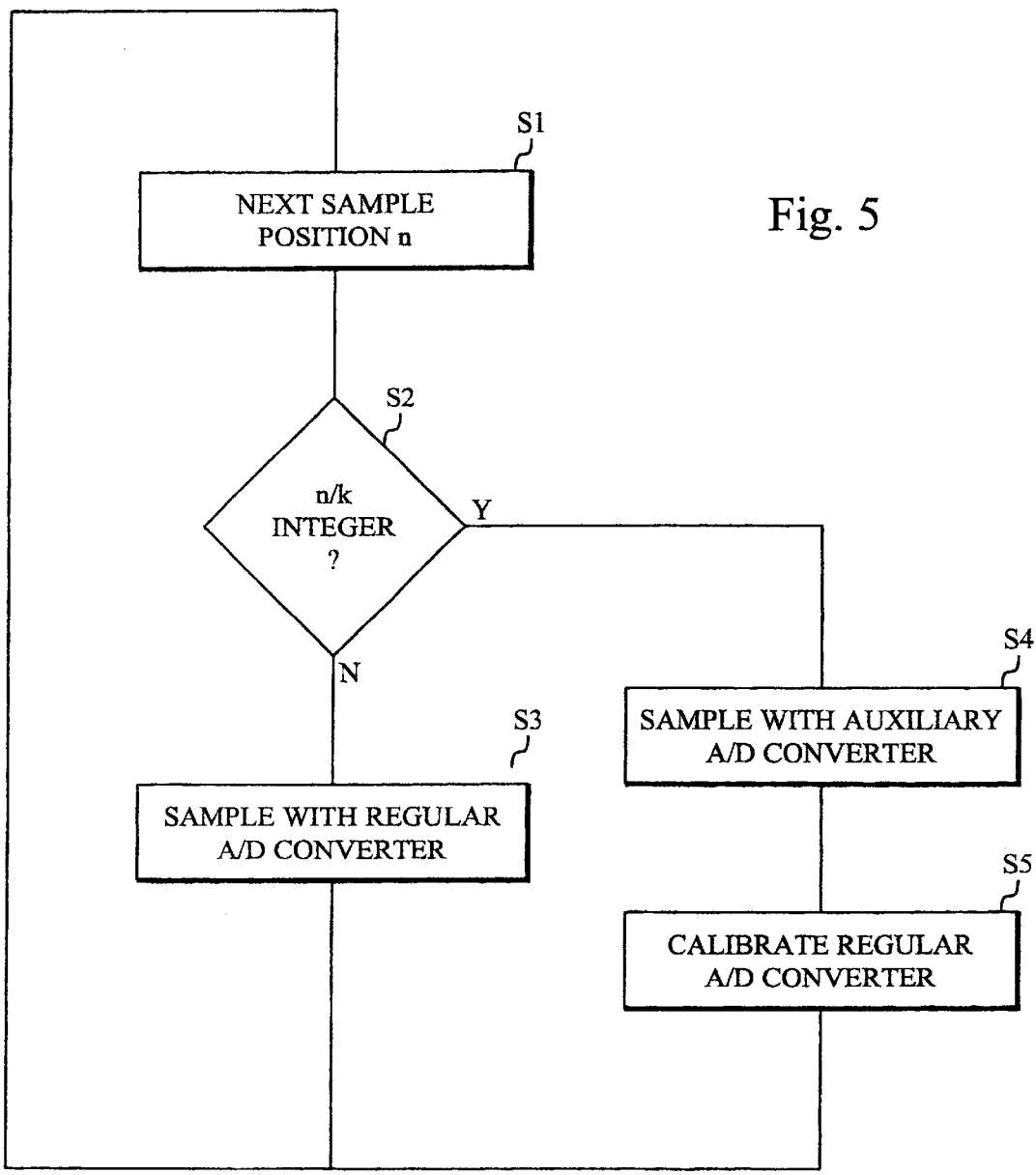
FIG. 5 is a flow chart illustrating the A/D conversion method of the present invention.

FIG. 5 is a flow chart illustrating the A/D conversion method of the present invention. Step S1 determines the next sample position n. Step S2 tests whether n/k is an integer (m in FIG. 3). Here k denotes the number of samples between calibrations. If n/k is not an integer, step S3 obtains the next sample with the regular A/D converter. If n/k is an integer, the next sample is obtained by the auxiliary A/D converter in step S4, and the regular A/D converter is calibrated in step S5. In both cases the procedure thereafter returns to step S1.

It is to be noted that the two A/D converters 10, 20 may be of different type.

Examples of different possible combinations are given in table 1 below.

TABLE 1

| A/D converter 10 | A/D converter 20 |
|---|---|
| Pipeline | Cyclic |
| Pipeline | Flash |
| Pipeline | Successive Approximation |
| Pipeline | Dual-slope |
| Pipeline | Pipeline |
| Flash | Cyclic |
| Flash | Flash |

These examples are in no way exhaustive. Other combinations are also possible. However, they demonstrate the flexibility offered by the present invention.

The required resolution $N_2$ of the auxiliary A/D converter, and how often it is possible to skip-and-fill, depends on the system specifications. A few simulation results are illustrated in FIGS. 6–8 as an indication of possible performance.

Figure 6:
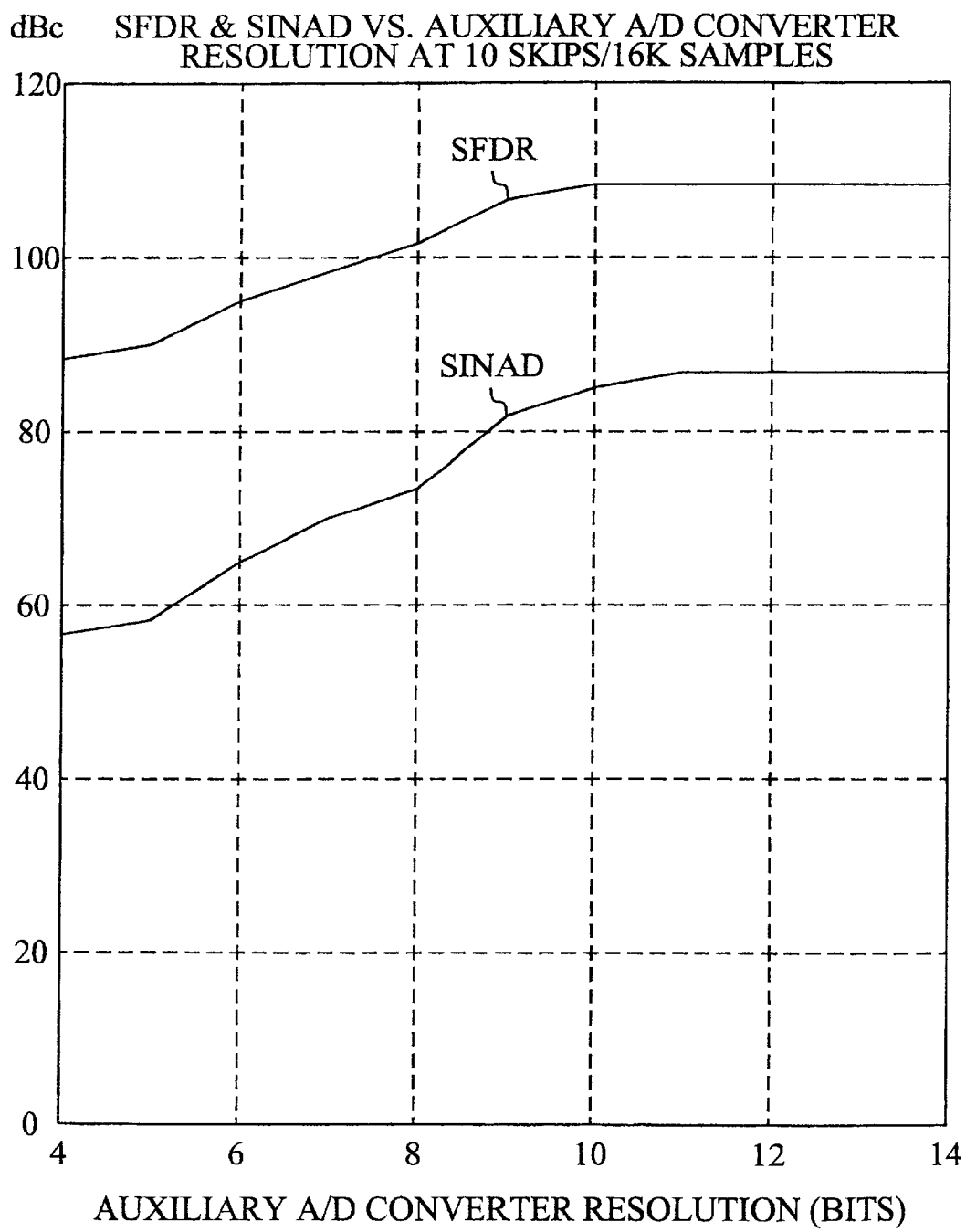
FIG. 6 is a diagram illustrating performance as a function of resolution of the auxiliary A/D converter for an A/D converter in accordance with the present invention.

FIG. 6 is a diagram illustrating performance as a function of resolution of the auxiliary A/D converter for an A/D converter in accordance with the present invention. An otherwise ideal 14-bit converter had 10 samples out of 16384 (16K) replaced by an $N_2$-bit sample. The SFDR (Spurious Free Dynamic Range) and SINAD (SIgnal-to-Noise-And-Distortion ratio) vs. $N_2$ are plotted in 20 FIG. 6. It is seen that for $N_2$ down to 10 bits, the spectral performance shows little or no degradation. For a simple design, it is reasonable to expect $N_2$ to reach 8 to 10 bits.

Figure 7:
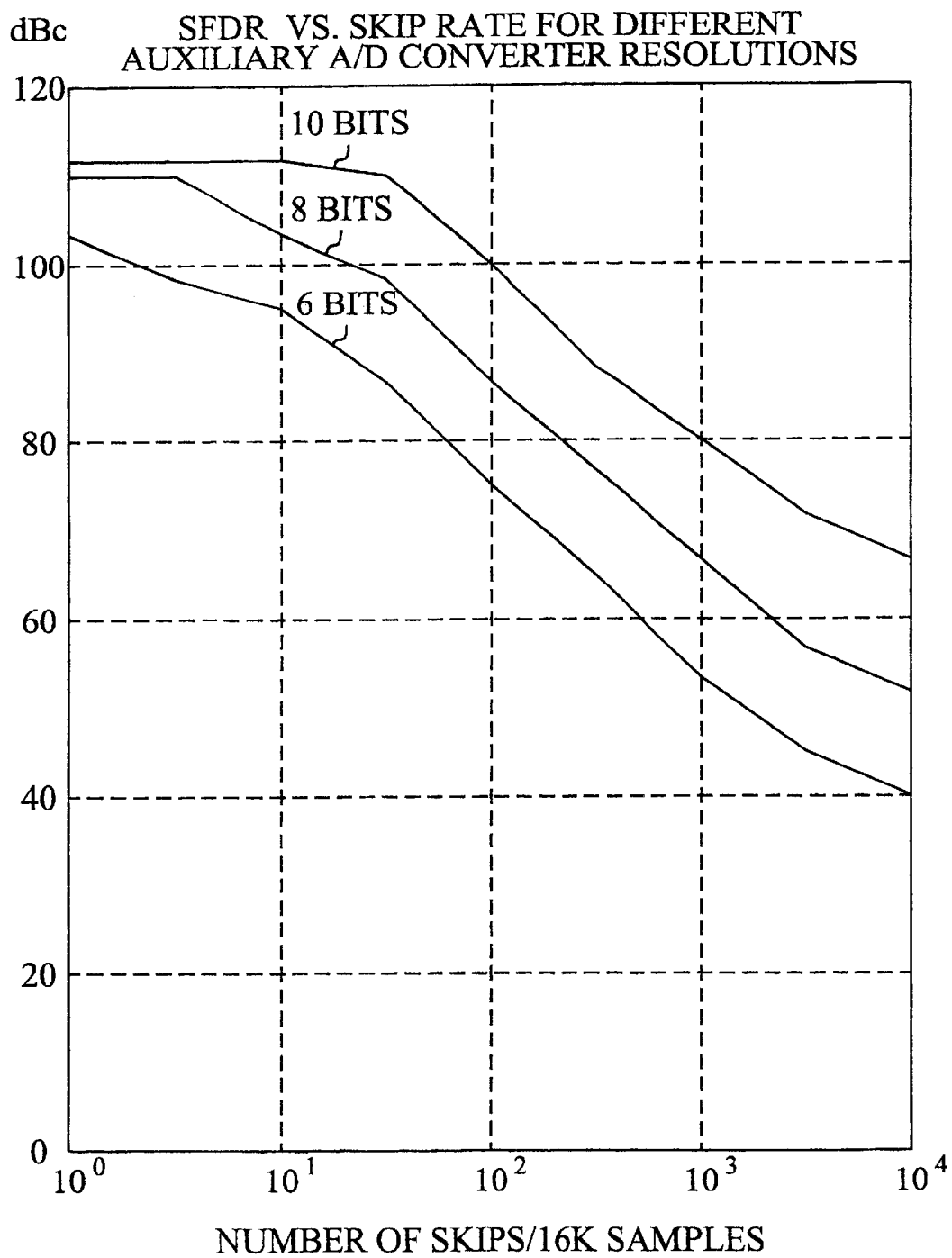
FIG. 7 is a diagram illustrating performance as a function of skip rate for an A/D converter in accordance with the present invention.

FIG. 7 is a diagram illustrating performance as a function of skip rate for an A/D converter in accordance with the present invention. FIG. 7 shows how the spectral performance SFDR depends on the skip rate for $N_2=\{6, 8, 10\}$ bits. The skip rate is swept from 1 to 10000 skips per 16384 samples, where the latter extreme is almost equivalent to a stand-alone $N_2$-bit converter. The simulations indicate that with a 10-bit auxiliary A/D converter, it is possible to skip-and-fill 10 to 30 samples per 16K with only a small degradation in spectral performance. With an 8-bit auxiliary A/D converter, 1 to 3 samples may be skipped, while a 6-bit auxiliary A/D converter has insufficient resolution.

Figure 8:
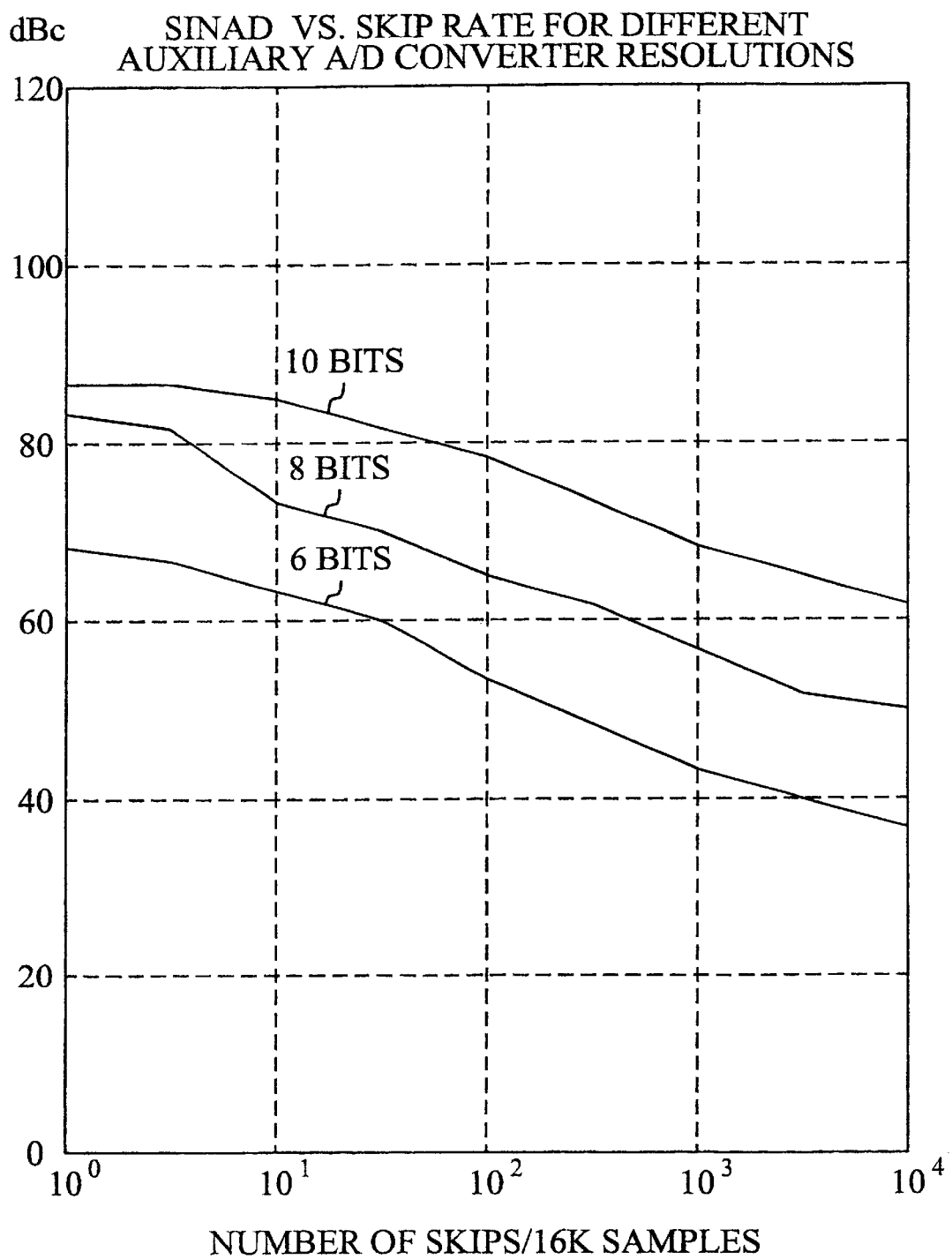
FIG. 8 is another diagram illustrating performance as a function of skip rate for an A/D converter in accordance with the present invention.

FIG. 8 is another diagram illustrating performance as a function of skip rate for an A/D converter in accordance with the present invention. It is similar to FIG. 7, but illustrates how the spectral performance SINAD depends on the skip rate for $N_2=\{6, 8, 10\}$ bits.

From FIGS. 6–8 it may be concluded that the performance requirements on the auxiliary A/D converter are much lower than on the regular A/D converter at low skip rates (The skip rate must be lower than half the sampling rate, typically much lower.). This is a very important feature of the present invention.

A few further embodiments are briefly described below.

The idle-time of the auxiliary A/D converter can be used for power-down to achieve low-power operation.

The requirement on settling/conversion time for the auxiliary A/D converter can be greatly relaxed by increasing the delay after the regular A/D converter.

The auxiliary A/D converter can use dynamic element matching to ensure that, while possibly having lower resolution, it does not have excessive non-linearity.

Allowing the auxiliary A/D converter to fill two or more consecutive samples, enables the use of background calibration schemes needing two or more consecutive samples for proper function. It is also possible to use two or more auxiliary A/D converters in parallel to fill two or more consecutive samples.

It is possible to use a dedicated sample-and-hold circuit for the auxiliary A/D converter, so that it can be fed with an input sample during a prolonged time. This can be useful for example when the auxiliary A/D converter is of successive approximation type.

In another embodiment of the invention the regular A/D converter may be interrupted at randomly instead of periodically selected sampling instants.

An important advantage of the present invention is that the auxiliary A/D converter converts the actual signal, as opposed to calculating an interpolated value from neighboring samples. Therefore, no pre-knowledge of the signal is needed, and the "fill" value inserted in accordance with the present invention, is accurately predicted even if the full Nyquist bandwidth is used for input signals.

Furthermore, the present invention represents a generic method, applicable to background calibration of most known wideband A/D converter architectures, and therefore covers a large number of applications, for example applications related to digital radio systems.

A further advantage is that the present invention is not limited to a particular calibration scheme. Instead, by using the present invention it becomes possible to choose from a wide range of existing background calibration schemes—schemes previously excluded due to the inherent bandwidth—limitations of interpolation-type skip-and-fill methods.

It will be understood by those skilled in the art that various modifications and changes may be made to the present invention without departure from the scope thereof, which is defined by the appended claims.

What is claimed is:

1. An A/D conversion method including the steps of:
   temporarily interrupting a first A/D converter for calibration purposes during an A/D conversion being performed at a first performance level;
   performing the A/D conversion during the interrupting of the first A/D converter in an auxiliary A/D converter operating at a performance level lower than the first performance level; and
   repeating the interrupting of the first A/D converter at a rate lower than half a sampling rate of said first A/D converter.

2. The method of claim 1, further including the step of interrupting said first A/D converter for calibration purposes over several consecutive sampling periods.

3. The method of claim 2, further including the step of performing A/D conversion in a plurality of auxiliary A/D converters during the interrupting of the first A/D converter over several consecutive sampling periods, the plurality of auxiliary A/D converters being arranged in parallel and each operating at a performance level lower than the first performance level.

4. The method of claim 1, further including the step of performing dynamic element matching in said auxiliary A/D converter for improving linearity.

5. The method of claim 1, further including the step of powering down said auxiliary A/D converter during an idle time.

6. The method of claim 1, further including the step of periodically interrupting said first A/D converter for calibration purposed.

7. The method of claim 1, further including the step of interrupting said first A/D converter for calibration purposes at randomly selected sampling instances.

8. An A/D converter system including:
   a first A/D converter capable of performing an A/D conversion at a first
   means for calibrating the first A/D converter;
   at least one auxiliary A/D converter capable of performing the A/D conversion at a performance level lower than the first performance level; and
   means for temporarily switching the A/D conversion from the first A/D converter to the at least one auxiliary A/D converter during at least one time interval when means for calibrating the first A/D converter is active, wherein switching the A/D conversion from the first A/D converter to the at least one auxiliary converter occurs at a rate that is lower than half a sampling rate of the first A/D converter.

9. The system of claim 8, wherein switching the A/D conversion from the first A/D converter to the at least one auxiliary A/D converter occurs over several consecutive sampling periods.

10. The system of claim 9, further including a plurality of auxiliary A/D converters for performing the A/D conversion when switching the A/D conversion from the first A/D converter over several consecutive sampling periods, the plurality of auxiliary A/D converters being arranged in parallel and each operating at a performance level lower than the first performance level.

11. The system of claim 8, further including a delay element arranged in a signal path after said first A/D converter for reducing settling and conversion time requirements on said auxiliary A/D converter.

12. The system of claim 8, further including a dedicated sample-and-hold circuit coupled to an input of the auxiliary A/D converter.

13. The system of claim 8, wherein said auxiliary A/D converter has a lower resolution than a resolution associated with the first A/D converter.

* * * * *